United States Patent
Black

(10) Patent No.: US 6,348,807 B2
(45) Date of Patent: *Feb. 19, 2002

(54) METHOD AND SYSTEM FOR UTILIZING MULTIPLE THERMOCOUPLES TO OBTAIN A TEMPERATURE CONTOUR MAP

(75) Inventor: J. Courtney Black, San Jose, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/199,840
(22) Filed: Nov. 24, 1998
(51) Int. Cl.[7] ............................................. G01R 31/26
(52) U.S. Cl. ...................... 324/765; 324/512; 324/158.1
(58) Field of Search ................................. 324/765, 754, 324/755, 758, 760, 771, 512, 515, 527, 531, 537, 158.1; 204/224 R; 205/656, 766; 438/80, 88

(56) References Cited

U.S. PATENT DOCUMENTS

| | | | | |
|---|---|---|---|---|
| 4,510,675 A | * | 4/1985 | Izu et al. ................. 204/224 R |
| 4,725,558 A | * | 2/1988 | Yamazaki et al. ............. 438/80 |
| 4,739,258 A | * | 4/1988 | Schwarz ...................... 324/537 |
| 5,162,742 A | * | 11/1992 | Atkins et al. ................ 324/523 |
| 5,260,668 A | * | 11/1993 | Mallory et al. ............. 324/719 |
| 5,320,723 A | * | 6/1994 | Kawakami ................... 205/656 |
| 5,473,259 A | * | 12/1995 | Takeda ........................ 324/760 |
| 5,929,651 A | * | 7/1999 | Leas et al. ................... 324/765 |

* cited by examiner

Primary Examiner—Ernest Karlsen
Assistant Examiner—Minh Tang
(74) Attorney, Agent, or Firm—Sawyer Law Group LLP

(57) ABSTRACT

A system and method for detecting a location of a short in a flip-chip device is disclosed. The flip-chip device includes a semiconductor die and a substrate. The semiconductor die has an active area including a surface. The semiconductor die also has a plurality of connections coupled with the surface of the active area. The method and system include supplying power to the semiconductor die and sensing a temperature at a plurality of locations while power is supplied to the semiconductor die. The temperature is sensed at the plurality of locations using at least one thermal couple. The plurality of locations is disposed between the plurality of connections.

14 Claims, 5 Drawing Sheets

METHOD AND SYSTEM FOR UTILIZING MULTIPLE THERMOCOUPLES TO OBTAIN A TEMPERATURE CONTOUR MAP

FIELD OF THE INVENTION

The present invention relates to fault detection in semiconductor devices and more particularly to a method and system for providing a temperature contour map of a semiconductor die in a flip-chip device, thereby providing a more accurate indication of the location of shorts in the semiconductor die.

BACKGROUND OF THE INVENTION

Semiconductor devices typically include a semiconductor die mounted to a substrate. The die includes an active area in which circuitry is formed. The circuitry in the active area is electrically coupled to the substrate using connections at the surface of the active area.

After fabrication of the semiconductor device, detection of the existence and positions of faults, such as shorts, is often desirable. For example, conventional semiconductor dies are mounted on a substrate with the active area at the top and the bottom of the die in contact with the substrate. This combination is a conventional device. Leads electrically connect the circuits in the active area to the substrate. To detect faults causing hot spots in such a circuit, a liquid crystal is conventionally used. A thin layer of liquid crystal is poured over the circuits at the top of the die. When power is applied to the die, the liquid crystal changes phase over some hot spots in the circuits. Due to the phase change, the color of the liquid crystal changes over the hot spots. The centers of areas where the liquid crystal has changed color mark the locations of shorts in the circuit. Consequently, the position of shorts in the circuit can be detected.

Although conventional liquid crystal detection can be used for circuits in conventional devices, this method does not function for flip-chip devices. In order to make electrical connection between the semiconductor die and the substrate, flip-chip devices mount the semiconductor die such that the active area faces the substrate. Connections, such as solder balls, on the surface of the active area make electrical contact to the substrate. Because the die in a flip-chip device is mounted with the active area in contact with the substrate, the circuits are not readily accessible. In addition, the portion of the semiconductor die below the circuits is significantly thicker than the portion of the semiconductor die in which the circuits are formed. Consequently, applying the liquid crystal to the readily accessible back of the die will not detect faults causing hot spots within the active area of the semiconductor die.

Furthermore, the application of the liquid crystal to the surface may not provide an accurate indication of the location of faults within the semiconductor die. Heat from shorts may dissipate non-uniformly in different directions. Thus, the center of the area in which the liquid crystal has undergone a phase change may not mark the location of the short. The position of the short may, therefore, not be accurately determined.

Accordingly, what is needed is a system and method for accurately detecting the positions of faults within a flip-chip device. The present invention addresses such a need.

SUMMARY OF THE INVENTION

The present invention provides a system and method for detecting a location of a short in a flip-chip device. The flip-chip device includes a semiconductor die and a substrate. The semiconductor die has an active area including a surface. The semiconductor die also has a plurality of connections coupled with the surface of the active area. The method and system comprise supplying power to the semiconductor die and sensing a temperature at a plurality of locations while power is supplied to the semiconductor die. The temperature is sensed at the plurality of locations using at least one thermal couple. The plurality of locations is disposed between the plurality of connections.

According to the system and method disclosed herein, the present invention allows temperature contours in the semiconductor die and, therefore, the locations of shorts to be detected more rapidly. Consequently, the ability to accurately detect shorts is increased.

DETAILED DESCRIPTION OF THE INVENTION

The present invention relates to an improvement in detection of faults in semiconductor devices, such as flip-chip devices. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
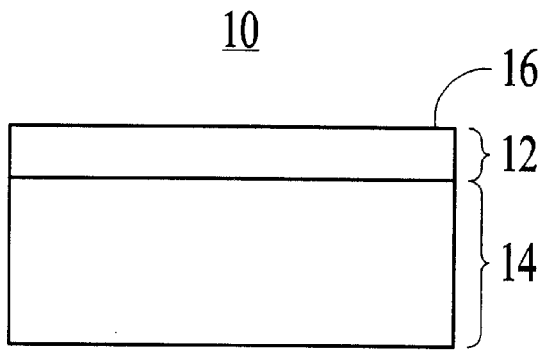
FIG. 1 is a diagram of a semiconductor die.

FIG. 1 is a block diagram of a conventional semiconductor die 10. Typically, the semiconductor used is silicon. The die 10 includes an active area 12 in which circuits (not shown) are formed. The surface 16 of the active area 12 is typically considered the top of the die 10. The die 10 also includes a second portion 14 under the active area 12. This second portion 14 will be referred to as the inactive area. The inactive area 14 is significantly thicker than the active area 12 in which the circuits are formed.

Figure 2:
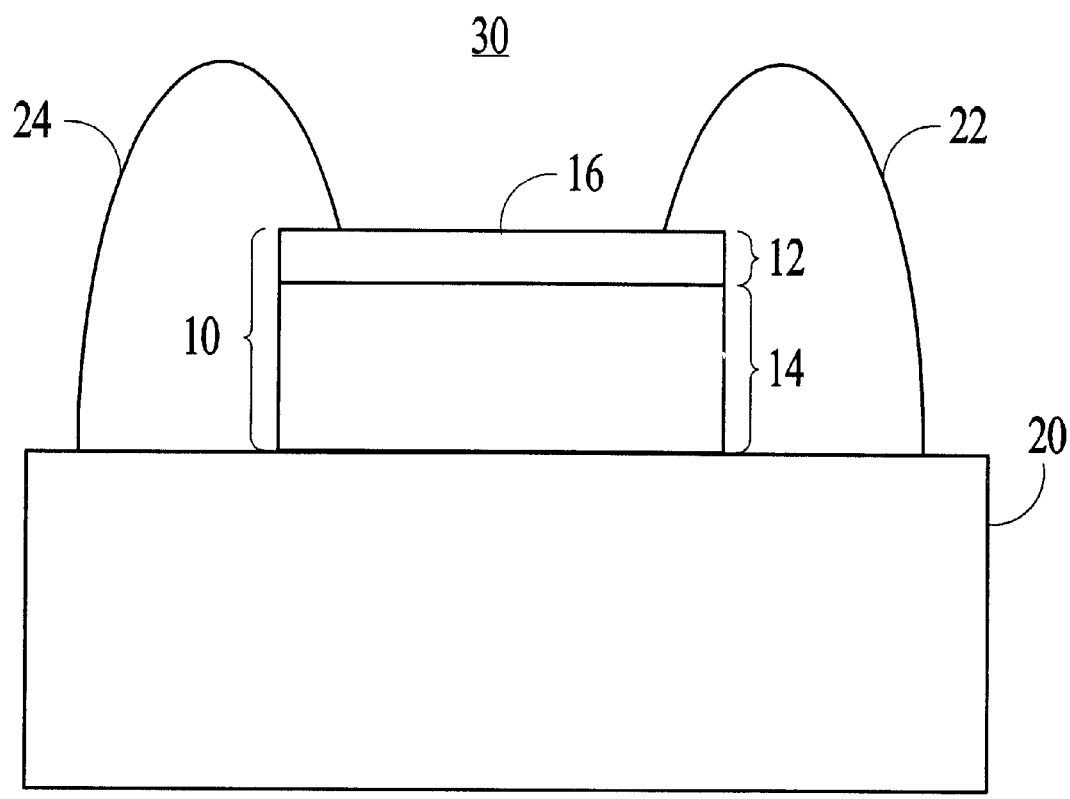
FIG. 2 is a diagram depicting a conventional device.

FIG. 2 depicts a conventional chip device 30. The conventional device 30 includes a die 10 mounted on a substrate 20. The die 10 is mounted so that the surface 16 is face up, away from the substrate 20. The bottom of the inactive area 14 contacts the substrate 20. Leads 22 and 24 electrically connected the circuits in the active area 12 of the die 10 to the wiring in the substrate 20.

It is often desirable to examine the conventional device 30 for faults such as junction shorts, metal shorts, or junction breakdowns in the circuits on the die 10. Typically these faults generate heat during operation of the circuits on the die 10. In addition to detecting the existence of such faults within the circuits, the positions of the faults should be determined.

Figure 3:
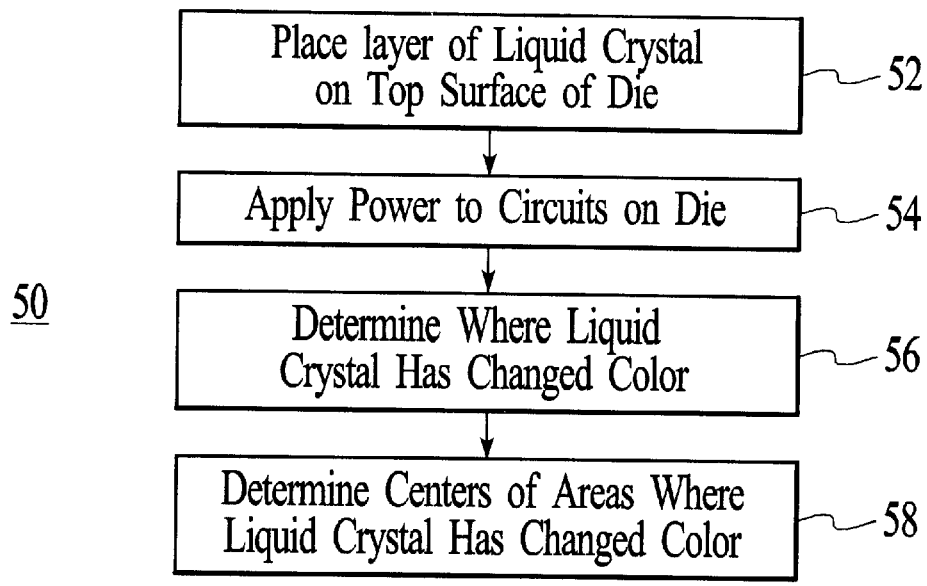
FIG. 3 is a flow chart depicting a conventional method of detecting faults in a conventional device.

FIG. 3 is a flow chart depicting a conventional method 50 for detecting faults in circuits in the device 30. A layer of a liquid crystal (not shown) is placed on the top surface of the die 10 via step 52. Thus, the liquid crystal is placed on the surface 16 of the active area 12 in step 52. The liquid crystal is in proximity to the circuits in the active area 12 of the die 10. Power is then applied to the circuits in the active area of the die 10, via step 54. Faults such as shorts or a junction breakdown will generate heat when power is applied to them. As a result, the liquid crystal undergoes a phase transition over a portion of the circuit in which the fault exists. The phase transition causes the liquid crystal over the portion of the circuit in which the fault exists to change color. Thus, it is determined via step 56 where the liquid crystal has changed color. The centers of the areas where the liquid crystal has changed color are then determined, via step 58. Shorts are presumed to be located at the center of the areas where the liquid crystal has changed color. Thus, the existence and position of faults can be determined.

Figure 4:
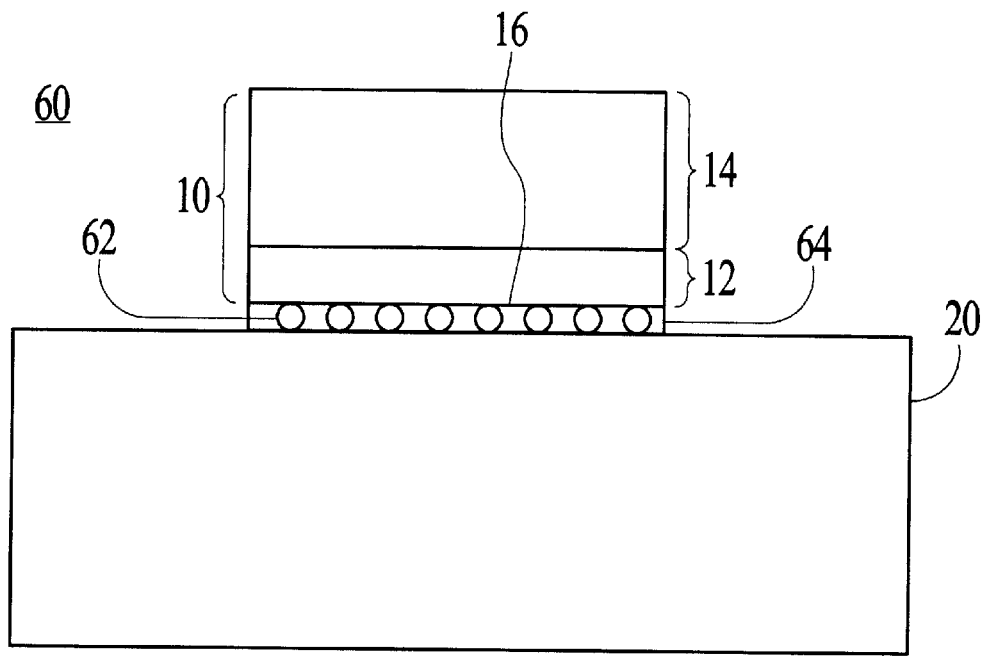
FIG. 4 is a diagram of side view of a flip-chip device.

Although the method 50 can detect faults in conventional devices, those with ordinary skill in the art will realize that the method 50 cannot detect faults in newer flip-chip devices. FIG. 4 depicts a flip-chip device 60. In the flip-chip device, the die 10 is mounted with the surface 16 of the active area 12 face down, in close proximity to the substrate 20. Electrical contact between the circuits in the active area 12 and the substrate 20 is made via connections 62. Typically, the connections 62 are solder balls. The die 10 is fixed to the substrate 20 using underfill 64 which also fills in gaps between the solder balls 62.

Because the active area 12 is not exposed in the flip-chip device 60, one of ordinary skill in the art will readily recognize that the method 50 shown in FIG. 3 will not detect faults. Referring back to FIG. 4, if a layer of liquid crystal is placed on the surface of the die 10 not in proximity to the substrate 20, the liquid crystal will be on the inactive area 14. The inactive area 14 is significantly thicker than the active area 12. Thus, the liquid crystal is not in proximity to the circuits and does not change color only in areas near faults. This is because heat generated by faults is dissipated by the relatively thick inactive area 14. Thus, the method 50 cannot detect faults in a flip-chip device.

One of ordinary skill in the art will also realize that even if the method 50 can be used to detect the existence of faults, the method 50 may not accurately determine the position of the fault. The method 50 estimates the location of the fault to be the center of the area in which the liquid crystal has undergone a phase change. However, heat may be dissipated nonuniformly by the die 10. For example, circuits in the active area 12 may be nonuniformly distributed. As a result, heat may dissipate much more quickly in one direction in a plane parallel to the surface of the die than in another direction in the plane. The liquid crystal also undergoes a phase change at a particular temperature. Two locations having different temperatures both of which are above the temperature required for the phase change will appear substantially the same. Similarly, two locations having different temperatures both of which are below the temperature required for the phase change will appear substantially the same. When heat is dissipated much more rapidly in one direction and the fault generates sufficient heat for a relatively large area of liquid crystal to change phase, the fault will not be located at the center of the area. Thus, estimating the position of the fault using the center of the area which has undergone a phase change will not accurately determine the location of the fault.

One of ordinary skill in the art will also readily realize that the liquid crystal used in the method 50 is a carcinogen. Thus, the method 50 may be hazardous to the health of an investigator using the method 50. Accordingly, a less dangerous method of detecting faults in the flip-chip device 60 would also be beneficial.

The present invention provides a system and method for detecting a location of a short in a flip-chip device. The flip-chip device includes a semiconductor die and a substrate. The semiconductor die has an active area including a surface. The semiconductor die also has a plurality of connections coupled with the surface of the active area. The method and system comprise supplying power to the semiconductor die and sensing a temperature at a plurality of locations while power is supplied to the semiconductor die. The temperature is sensed at the plurality of locations using at least one thermal couple. The plurality of locations is disposed between the plurality of connections.

The present invention will be described in the context of locating faults which generate heat. Thus, the present invention will be described in the context of detecting the location of shorts. However, one of ordinary skill in the art will readily recognize that this method and system will operate effectively for other types of analysis where accurate determinations of temperatures across the surface of the semiconductor die are used.

Figure 5A:
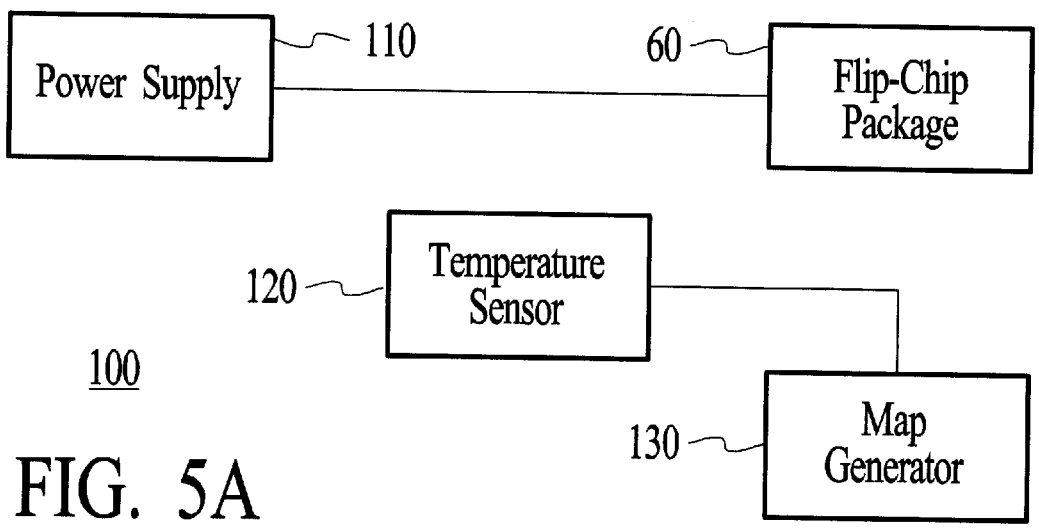
FIG. 5A is a block diagram of a system for generating a temperature contour map of a semiconductor die in accordance with the present invention.

To more particularly illustrate the method and system in accordance with the present invention, refer now to FIG. 5A depicting a block diagram of one embodiment of such a system 100. The system 100 includes a power supply 110 which is electrically coupled to the flip-chip device 60. The power supply 110 is coupled to the semiconductor die 10 such that circuits in the active area 12 (not shown in FIG. 5A) will be activated. Also depicted in FIG. 5A is a temperature sensor 120 coupled to a map generator 130. The temperature sensor 120 includes at least one thermal couple. In one embodiment, the map generator 130 includes a computer which is capable of both storing data and generating a map.

Figure 5B:
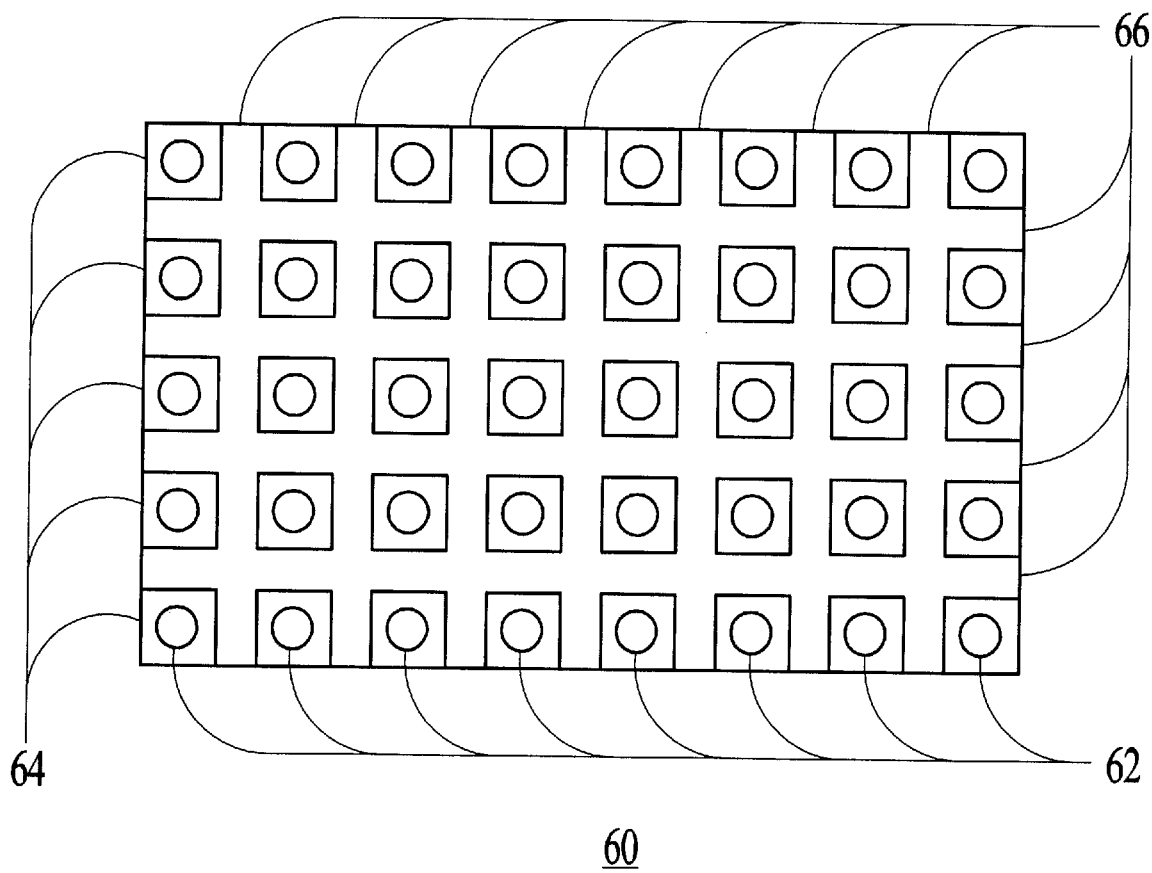
FIG. 5B is a diagram of a plan view of the surface of the active area of a flip-chip device.

FIG. 5B depicts the surface 16 of the active area 12. Because the semiconductor die 10 has been mounted to the substrate 20 at the active surface, underfill 64 surrounds the solder balls 62. Typically, the solder balls are separated by a distance on the order of 0.1 mm. In preparation for fault detection, channels 66 have been formed in the underfill. Thus, the temperature sensor will be used to sense the temperature of the surface 16 in the locations of the channels 66, where the surface 16 is exposed.

Figure 6A:
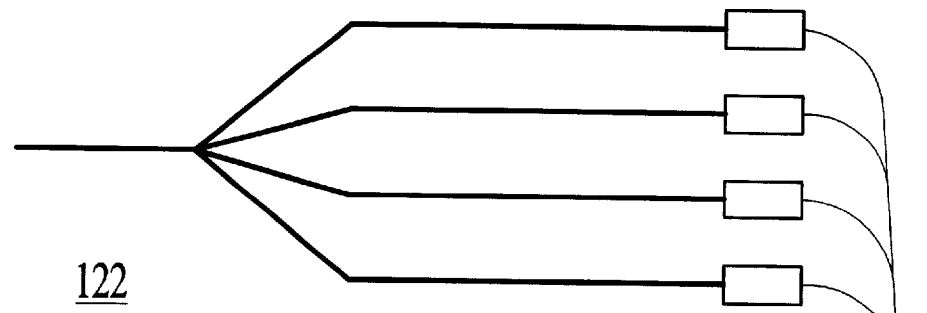
FIG. 6A is a diagram of one embodiment of an array of thermal couples in accordance with the present invention.
Figure 6B:
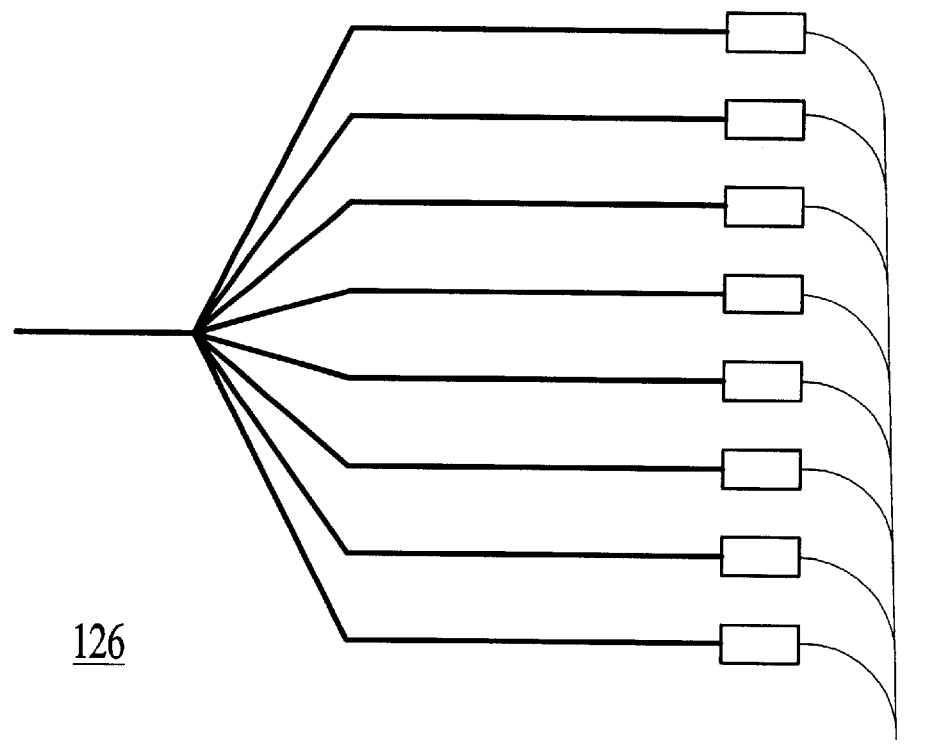
FIG. 6B is a diagram of another embodiment of an array of thermal couples in accordance with the present invention.

FIGS. 6A and 6B depict preferred embodiments of the temperature sensor 120. FIG. 6A depicts a temperature sensor 122 having an array of four thermal couples 124. FIG. 6B depicts a temperature sensor 126 having an array of eight thermal couples 128. Because arrays of multiple thermal couples are used in the sensors 122 and 126, temperature can be sensed at a number of locations in the channels 66 at a single time. Preferably, the spacing between thermal couples 126 and 128 in an array is on the order of the spacing between connections on the surface 16 of the semiconductor die 10 in the flip-chip 60. As a result, the thermal couples 124 and 128 will readily fit in the channels 66. Because multiple thermal couples are used in the sensors 122 and 126, the time taken to detect faults can be reduced.

Figure 7:
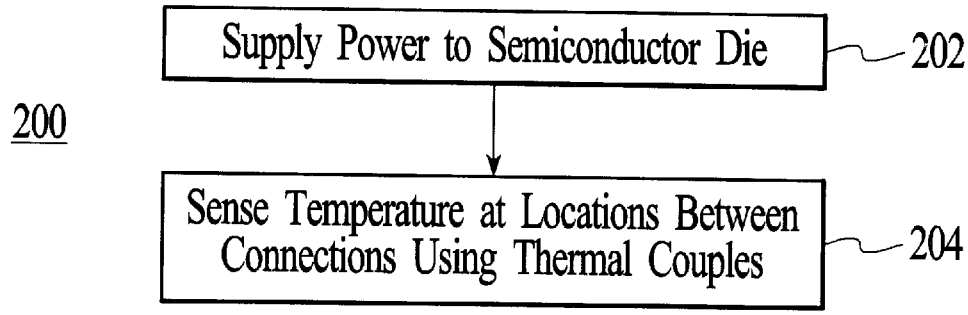
FIG. 7 is a flow chart of a method for generating a temperature contour map of a semiconductor die in accordance with the present invention.

FIG. 7 depicts one embodiment of a method 200 for detecting faults in accordance with the present invention. Power is supplied to circuits in the semiconductor die 10, via step 202. Temperature is then sensed at locations between the solder bumps 62 using thermal couples, via step 204. Also in step 204, the temperature is sensed while power is supplied to the die 10. Preferably, temperature is sensed at the surface 16 of the active area 12 in the channels 66.

Because temperature is accurately sensed by the thermal couples in the temperature sensor 120, the distribution of temperature over the surface 16 of the die 10 can be determined. As a result, the location of faults can be determined in the flip-chip device 60. Moreover, because a more accurate determination of temperature is made, the size of the fault can be estimated, with larger faults generated more heat and a higher temperature. In addition, non-uniformities in heat dissipation in the die 10 can be determined. Consequently, the location of faults, such as shorts, can be more accurately determined. Furthermore, the method 200 does not require the use of the carcinogenic liquid crystal.

Figure 8:
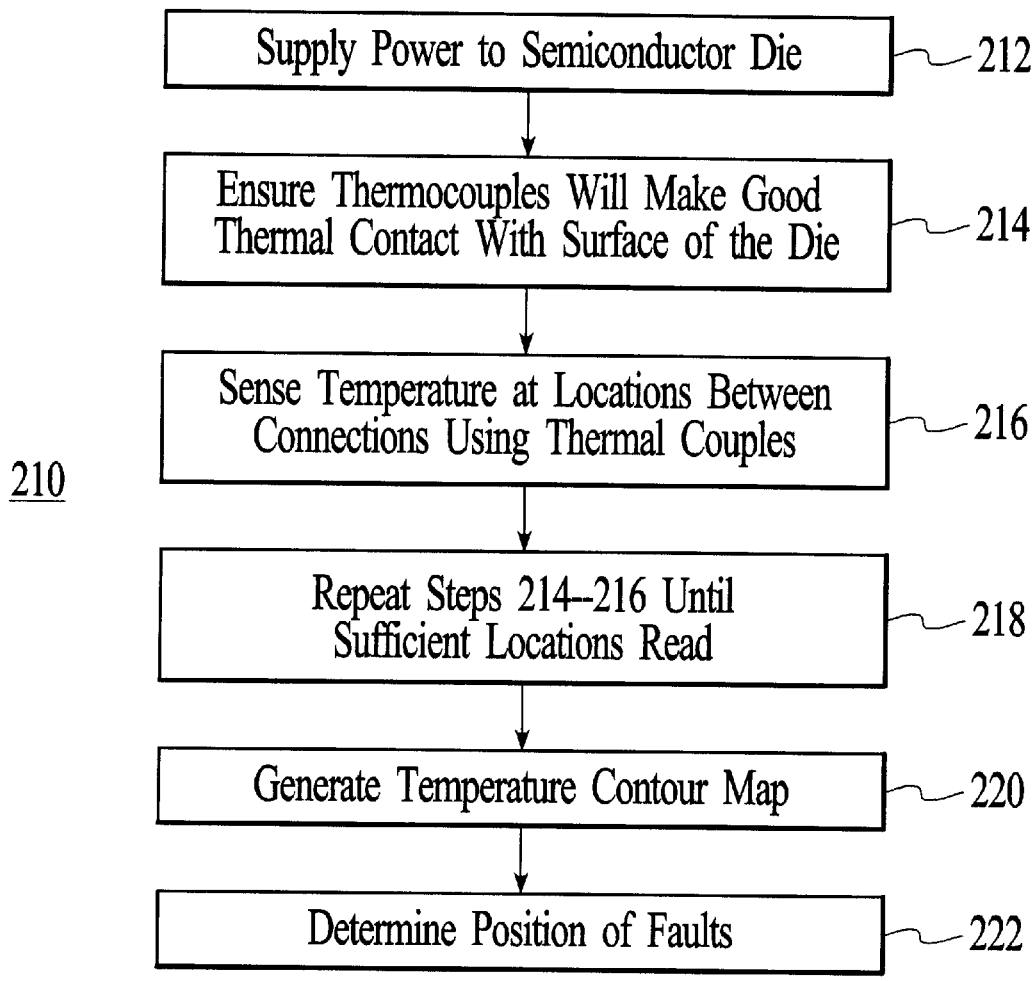
FIG. 8 is a more detailed flow chart of a method for generating a temperature contour map of a semiconductor die in accordance with the present invention.

FIG. 8 depicts a more detailed flow chart of one embodiment of a method 210 in accordance with the present invention. Power is supplied to circuits in the semiconductor die 10, via step 212. It is then ensured that thermal couples in the temperature sensor 120 will be in good thermal contact with the surface 16 during use, via step 214. In a preferred embodiment, step 214 includes applying a thermally conductive paste to thermal couples in the temperature sensor 120. Temperature is then sensed at locations between the solder bumps 62 using thermal couples, via step 216. Also in step 216, the temperature is sensed while power is supplied to the die 10. Preferably, temperature is sensed at the surface 16 of the active area 12 in the channels 66. Steps 214 and 216 are then repeated until temperature has been sensed with sufficient spatial resolution across the surface 16 of the active area 12, via step 218. In one embodiment, temperature is sensed at least at the intersection of channels 66 between solder balls 62. However, in a preferred embodiment, temperature is sensed at more locations than the intersections of the channels 66. Thus, in a preferred embodiment, the spatial resolution is at least 0.1 mm and as small as one micron. In a preferred embodiment, the desired spatial resolution depends on the features size and, to a certain extent, scales with the feature size. Also in a preferred embodiment, the desired spatial resolution depends upon the uniformity of the distribution of circuits in the die 10 and the density of circuits in the die 10. Thus, in a preferred embodiment, it may be desirable to read temperatures at a higher spatial resolution in some directions and in some areas of the die 10. Via step 220, a temperature contour map is generated from the data collected in steps 214–218. Based on the temperature contour map, the positions of faults are then detected, via step 222.

Because the values of temperatures can be sensed at the desired spatial resolution, detection of faults is improved. In particular, faults in a flip-chip device can be detected. In addition, the location of faults need no longer be estimated from the center of an area having at least the temperature at which liquid crystal undergoes a phase change. Instead, the temperature can be accurately determined over the surface 16. The area having the highest temperature can be determined as the position of the fault. Thus, the position of faults can be more accurately determined in the flip-chip 60. Moreover, because temperature can be more accurately determined, the size of the fault can be determined. Shorts carrying more current will result in more heat and, therefore, a higher temperature. Consequently, the size of faults, such as shorts, can be determined using the method 200 or 210. In addition, the use of carcinogenic liquid crystal is avoided.

A method and system has been disclosed for detection of faults in a semiconductor die of a flip-chip. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for detecting a position of a short in a flip-chip device including a semiconductor die and a substrate, the semiconductor die having an active area including a surface and a plurality of connections coupled with the surface of the active area, the method comprising the steps of:

(a) supplying power to the semiconductor die; and (b) measuring a temperature at each of a plurality of locations on the surface using at least one thermal couple while power is supplied to the semiconductor die, the plurality of locations being disposed between the plurality of connections, each location of a portion of the plurality of locations being separated by a distance, the distance capable of being less than or equal to 0.1 mm; and (c) determining the position of the short based on the temperature of each of a portion of the plurality of locations;

wherein the semiconductor die is mounted to the surface of the substrate using an underfill disposed between the plurality of connections and between the substrate and the surface and wherein a portion of the underfill at the plurality of locations has been removed to measure the temperature at the plurality of locations.

2. The method of claim 1 wherein the position determining step (c) further includes the step of:

(c1) providing a map correlating the temperature of each of the plurality of locations with each of the plurality of locations on the surface.

3. The method of claim 2 wherein the temperature measuring step (b) further includes the step of:

(b1) measuring a temperature at the plurality of locations on the surface using an array including a plurality of thermal couples, the array of thermal couples being configured to fit between a portion of the plurality of connections.

4. The method of claim 3 further comprising the step of:

(d) determining the position of the short using the map.

5. The method of claim 3 wherein the temperature measuring step (b) further includes the step of:

(b1) providing thermal contact between each of the plurality of thermal couples and the surface utilizing a thermal paste.

6. The method of claim 5 wherein the plurality of thermal couples further includes four thermal couples.

7. The method of claim 5 wherein the plurality of thermal couples further includes eight thermal couples.

8. The method of claim 1 wherein the distance is capable of being less than or equal to one micron.

9. A system for detecting a position of a short in a flip-chip device including a semiconductor die and a substrate, the semiconductor die having an active area including a surface and a plurality of connections coupled with the surface of the active area, the system comprising:

means for supplying power to the semiconductor die and at least one thermal couple, the at least one thermal couple for sensing a temperature at each of a plurality of locations on the surface while power is supplied to the semiconductor die, the plurality of locations being disposed between the plurality of connections, each location of a portion of the plurality of locations being separated by a distance, the distance capable of being less than or equal to 0.1 mm, thereby allowing the position of the short to be detected based on the temperature at each of a portion of the plurality of locations; and wherein the semiconductor die is mounted to the surface of the substrate using an underfill disposed between the plurality of connections and between the substrate and the surface and wherein a portion of the underfill at the plurality of locations has been removed to measure the temperature at the plurality of locations.

10. The system of claim 9 further comprising:

means for providing a map correlating the temperature of each of the plurality of locations with each of the plurality of locations on the surface.

11. The system of claim 10 wherein the at least one thermal couple further includes:

an array including a plurality of thermal couples, the array of thermal couples being configured to fit between a portion of the plurality of connections.

12. The system of claim 11 wherein the plurality of thermal couples further includes four thermal couples.

13. The system of claim 11 wherein the plurality of thermal couples further includes eight thermal couples.

14. The system of claim 9 wherein the distance is capable of being less than or equal to one micron.

* * * * *